US010431967B2

(12) United States Patent
MacGowan et al.

(10) Patent No.: US 10,431,967 B2
(45) Date of Patent: Oct. 1, 2019

(54) APPARATUS FOR CABLE MANAGEMENT

(71) Applicant: Eaton Corporation, Cleveland, OH (US)

(72) Inventors: Michael Rowe MacGowan, Candler, NC (US); Timothy Fair, Boiling Springs, SC (US); Daniel Edward Hrncir, Arden, NC (US); Robert Judson Burns, Hendersonville, NC (US)

(73) Assignee: Eaton Intelligent Power Limited, Dublin (IE)

( * ) Notice: Subject to any disclaimer, the term of this patent is extended or adjusted under 35 U.S.C. 154(b) by 0 days.

(21) Appl. No.: 15/668,998

(22) Filed: Aug. 4, 2017

(65) Prior Publication Data

US 2019/0044312 A1    Feb. 7, 2019

(51) Int. Cl.
*H02G 3/04* (2006.01)
*H02G 3/32* (2006.01)
*H05K 7/12* (2006.01)
*H02B 1/20* (2006.01)

(52) U.S. Cl.
CPC .......... *H02G 3/0406* (2013.01); *H02B 1/202* (2013.01); *H02G 3/32* (2013.01); *H05K 7/12* (2013.01)

(58) Field of Classification Search
CPC .................................................. H02G 3/0406
USPC .................................................. 174/72 A, 68.3
See application file for complete search history.

(56) References Cited

U.S. PATENT DOCUMENTS

| 4,494,520 A * | 1/1985 | Hurwitz | H01R 4/646 |
|---|---|---|---|
| | | | 123/633 |
| 9,469,239 B2 * | 10/2016 | Armour | B60P 7/083 |
| 9,796,322 B1 * | 10/2017 | Miller | B60P 7/083 |

* cited by examiner

*Primary Examiner* — Dhiru R Patel
(74) *Attorney, Agent, or Firm* — Benesch Friedlander Coplan & Aronoff LLP

(57) ABSTRACT

A cable management system maintains separation laterally between a plurality of distinct phase conductors, each of which includes one or more insulated electrical cables. The system includes an electrically non-conductive brace having free ends, a length between the free ends, and predetermined conductor locations that are spaced apart from one another along the length. Apertures extend through the brace at the conductor locations. The cable management system further includes retainer straps and strap locks. Each retainer strap reaches around a corresponding conductor at one of the conductor locations on one side of the brace, and reaches further through a corresponding pair of the apertures to the opposite side of the brace. Each strap lock engages a retainer strap at one side of the brace to retain a corresponding conductor in place at the conductor location on the opposite side of the brace.

20 Claims, 4 Drawing Sheets

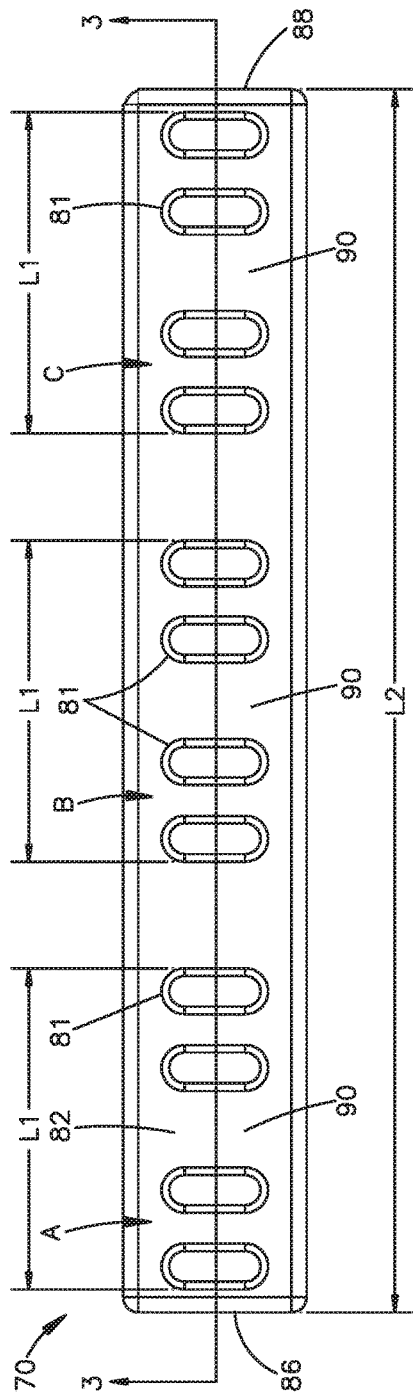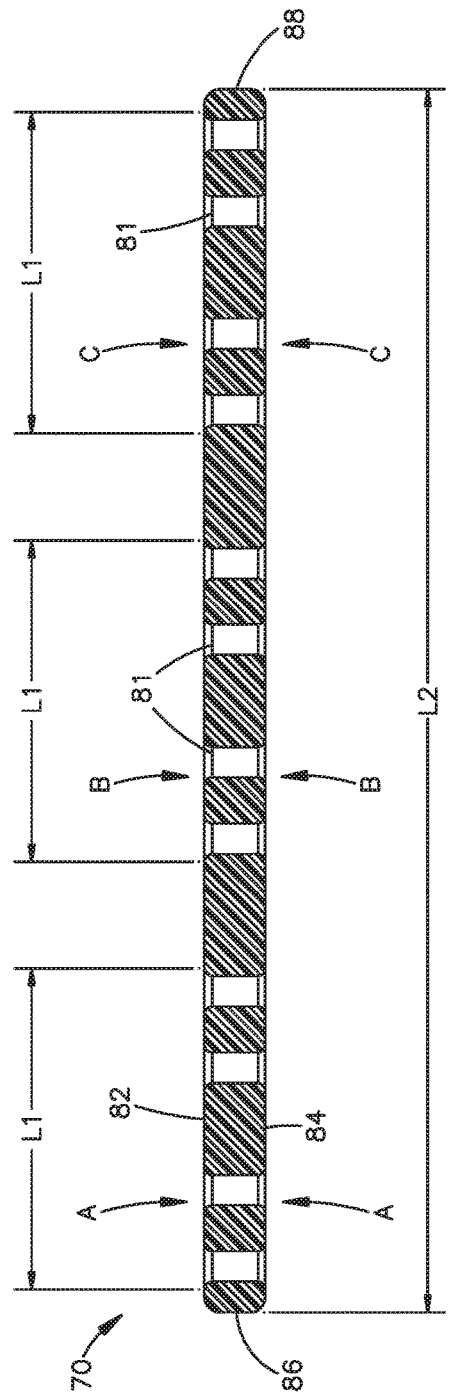

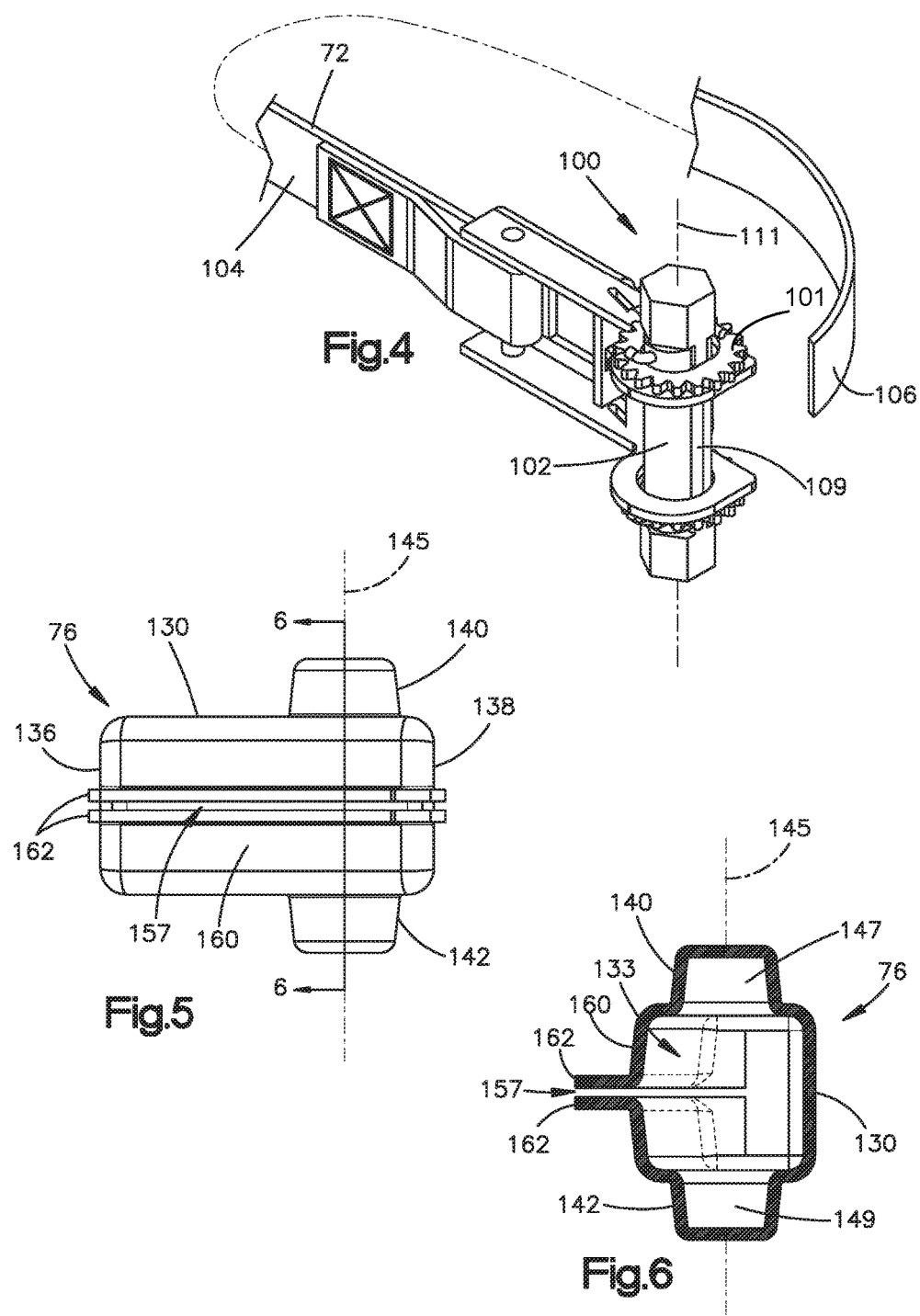

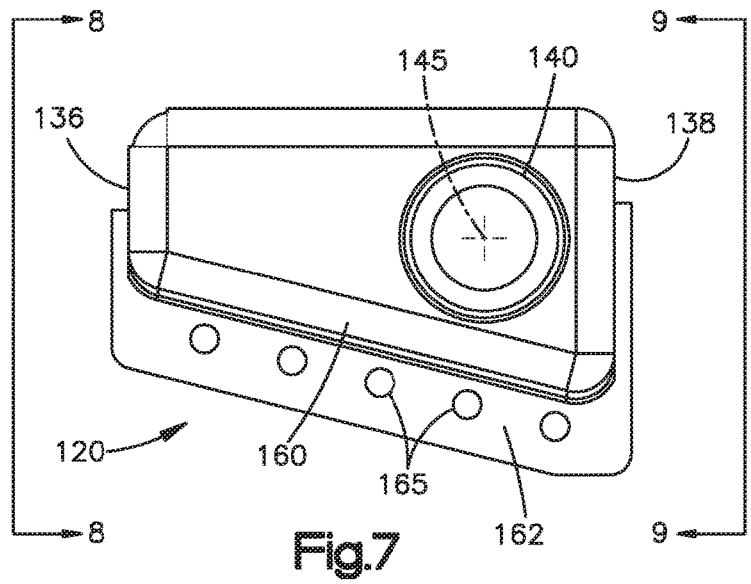
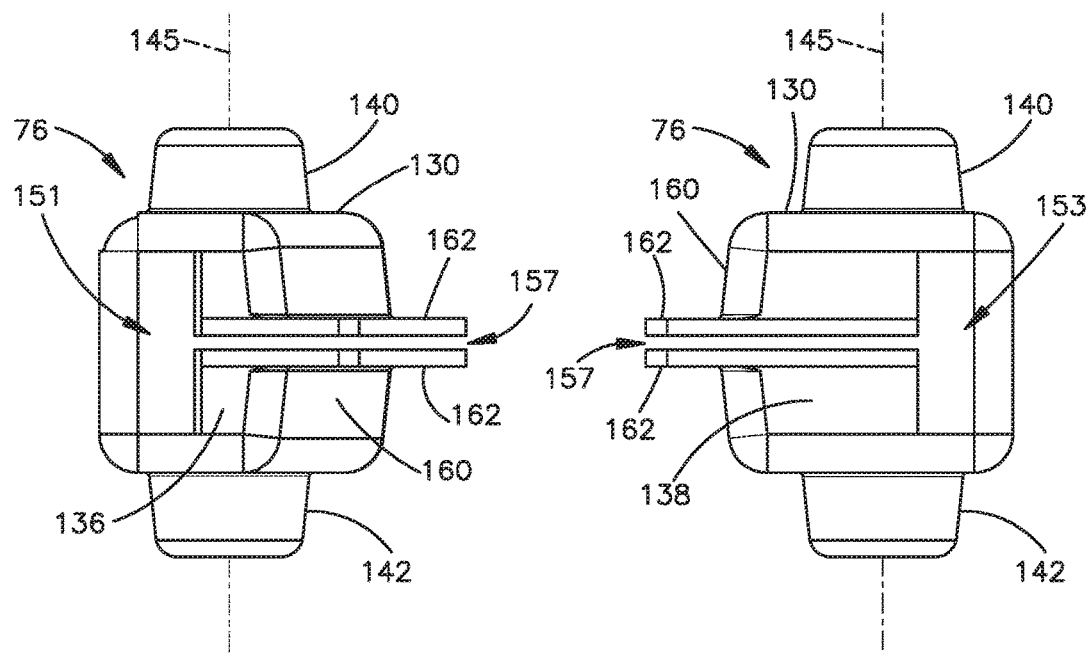

APPARATUS FOR CABLE MANAGEMENT

TECHNICAL FIELD

This technology includes structures for restraining oscillation of electrical cables under the influence of magnetic fields.

BACKGROUND

A switchgear assembly may include distinct phase conductors for connecting a circuit breaker between a current source and a load. Magnetic fields that are generated in a short circuit event can urge a conductor to alternately repel and attract an adjacent conductor. This can induce lateral oscillations which, if not restrained, could damage the apparatus.

SUMMARY

A cable management system is provided to maintain separation laterally between a plurality of distinct phase conductors, each of which includes one or more insulated electrical cables. The cable management system includes an electrically non-conductive brace having free ends, a length between the free ends, and predetermined conductor locations that are spaced apart from one another along the length. Apertures extend through the brace at the conductor locations. The cable management system further includes retainer straps and strap locks. Each retainer strap reaches around a corresponding conductor at one of the conductor locations on one side of the brace, and reaches further through a corresponding pair of the apertures to the opposite side of the brace. Each strap lock engages a retainer strap at one side of the brace to retain a corresponding conductor in place at the conductor location on the opposite side of the brace.

In a given example, the system further includes electrically nonconductive housings containing the strap locks. Each housing has an opening for passage a strap lock into and out of the housing. Each housing also has a clamshell configuration. The clamshell configuration has a nominal condition in which the opening is shaped as a slot. The housing is formed of an elastically pliable material enabling deflection of the claim shell configuration to enlarge the opening for passage of the strap lock.

BRIEF DESCRIPTION OF THE DRAWINGS

FIG. 2 is a side view of a support bracket included in the system of FIG. 1.

FIG. 3 is a sectional view taken on line 3-3 of FIG. 2.

FIG. 4 is perspective view of a retainer strap and a ratchet mechanism included in the system of FIG. 1.

FIG. 5 is a front view of a lock housing included in the system of FIG. 1.

FIG. 6 is a sectional view taken on line 6-6 of FIG. 5.

FIG. 7 is a top view of the housing shown in FIG. 5.

FIG. 8 is an end view of the housing shown in FIG. 5.

FIG. 9 is an opposite end view of the housing shown in FIG. 5.

DETAILED DESCRIPTION

Figure 1:
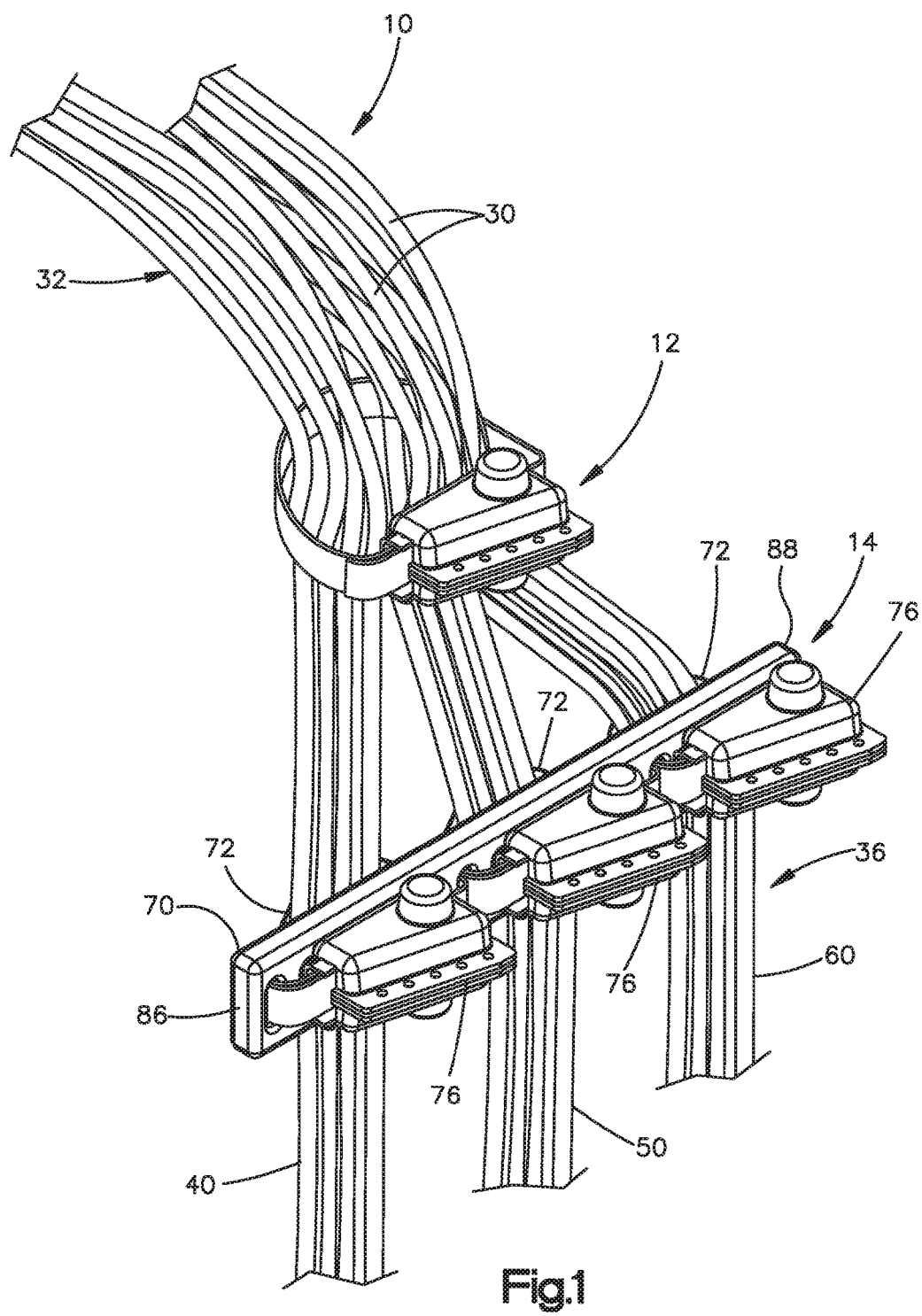
FIG. 1 is a perspective view of a cable management system mounted on cables.

The structures illustrated in the drawings include examples of the elements recited in the claims. The illustrated structures thus include examples of how a person of ordinary skill in the art can make and use the claimed invention. These examples are described to meet the enablement and best mode requirements of the patent statute without imposing limitations that are not recited in the claims. One or more of the elements of one embodiment may be used in combination with, or as a substitute for, one or more elements of another as needed for any particular implementation of the invention.

FIG. 1 shows parts of a low voltage switchgear apparatus for connecting a circuit breaker between an electric power source and a load. The parts shown in FIG. 1 include a busway 10, a cable retainer assembly 12, and a conductor separation assembly 14. In this example, the busway 10 includes multiple insulated electrical cables 30. The retainer assembly 12 gathers and holds the cables 30 together in a single bundle 32 reaching upward from the retainer assembly 12. The separation assembly 14 separates the bundle 32 of cables 30 into distinct phase conductors 36 that reach downward beneath the retainer assembly 12. The conductors 36 in the illustrated example include an A phase conductor 40, a B phase conductor 50, and a C phase conductor 60.

Magnetic fields that are generated in a short circuit event can urge each conductor 36 to alternately repel and attract the adjacent conductor 36. This can induce lateral oscillations which, if not restrained, could damage the conductors 36 as well as lugs or other cable termination devices (not shown) at lower ends of the conductors 36. The separation assembly 14 helps to prevent such damage by maintaining the A, B and C phase conductors 40, 50 and 60 at locations laterally spaced apart from one another as shown in FIG. 1.

The separation assembly 14 includes a support brace 70. The brace 70 reaches laterally across the busway 10 fully between the A phase conductor 40 and the C phase conductor 60. Other parts of the separation assembly 14 that are shown in FIG. 1 include three retainer straps 72 and three corresponding lock housings 76, each of which is associated with a corresponding one of the A, B and C phase conductors 40, 50 and 60.

The brace 70 is electrically nonconductive, and may be formed of any suitable nonconductive material such as, for example, glass polyester. As shown separately in FIGS. 2 and 3, the brace 70 in the illustrated example is a flat rectangular bar. Apertures 81 extend through the brace 70 between its opposite sides 82, 84, and are arranged in an array reaching along the length L of the brace 70 between its opposite ends 86, 88. Specifically, the apertures 81 are arranged at predetermined conductor locations A, B and C at the opposite sides 82 and 84 of the brace 70. The conductor locations A, B and C have equal individual lengths L1 reaching partly along the length L2 of the brace 70, are spaced apart from one another along the length L2 of the brace 70. Each conductor location A, B and C has two or more apertures 81, and preferably has an elongated surface region 90 extending lengthwise between an adjacent pair of the apertures 81, as shown for example in FIG. 2.

Like the brace 70, the retainer straps 72 are electrically nonconductive and may be formed of any suitable nonconductive material. The straps 72 in the given example are thus formed of woven nylon.

Each of the three retainer straps 72 is associated with one of the three corresponding strap locks 100. The strap locks 100 in the illustrated example are ratchet mechanisms 101 with spools 102, as shown for example in FIG. 4. A first end portion 104 of each strap 72 is anchored to the corresponding ratchet mechanism 101. A second end portion 106 of the strap 72 is received through a slot 109 in the spool 102 for winding on the spool 102. The ratchet mechanism 101 operates in a known manner to control rotation of the spool 102 about its axis 111 to selectively lock, retain, and release the strap 72 at any desired length at which it is wound onto the spool 102, and may have any suitable configuration known in the art.

The ratchet mechanisms 101 comprise metal parts, and are conductive accordingly. For this reason the lock housings 76 are provided to enclose the ratchet mechanisms 101, and are formed of electrically nonconductive material.

The lock housings 76 in the illustrated example are alike, with each having the configuration of the housing 76 shown in FIGS. 5-9. A body portion 130 of the housing 76 defines a chamber 133 (FIG. 6) that is sized and shaped to contain a ratchet mechanism 101 and corresponding retainer strap 72.

As viewed from above in FIG. 7, the body 130 is elongated and tapered from a wider end 136 to a narrower end 138. Upper and lower projections 140 and 142 are located near the wider end 138. The projections 140 and 142 have circular cross-sections centered on an axis 145, and define recessed chamber sections 147 and 149 for containing the opposite ends of the ratchet spool 110 (FIG. 4).

The narrower end 138 of the housing body 130 has a slot 151 (FIG. 8) for passage of the first end portion 104 of the retainer strap 72. The wider end 138 likewise has a slot 153 (FIG. 9) for passage of the second end portion 106 of the strap 72.

The body 130 further has an insertion slot 157. The insertion slot 157 reaches fully along the front side 160 of the body 130, as viewed in FIG. 5, and partly across the opposite ends 136 and 138, as shown in FIGS. 8 and 9. This imparts a clamshell configuration so the body 130 can be deflected from the nominal condition of FIGS. 5-9 to an opened condition in which the insertion slot 157 is enlarged sufficiently for passage of the ratchet mechanism 101 and retainer strap 72 into and out of the chamber 133. Accordingly, the body 130 is formed of a material that is both electrically nonconductive and elastically pliable as needed for manual deflection to enlarge the insertion slot 157.

As further shown in FIGS. 5-9, a pair of flanges 162 extend along opposite sides of the insertion slot 157. The flanges 162 have aligned rows of apertures 165 for receiving electrically nonconductive fasteners, such a plastic cable ties, to fasten the insertion slot 157 in a closed condition.

In an example of installing the separation assembly 14 as shown in FIG. 1, a ratchet mechanism 100 and associated retainer strap 72 are first placed within a corresponding housing 76. With the housing 76 held at one side 82 of the bracket 70, the first end portion 104 of the strap 72 is passed through one of the apertures 81 to emerge at the A phase location on the other side 84 of the bracket 70. The strap 72 is then extended around the cables 30 of the A phase conductor 40 to hold it against the surface region 90 (FIG. 2) of that A phase location. The second end portion 106 of the strap 72 then is passed back through an aperture 81 at the other end of the A phase location, and the ratchet mechanism 101 is tightened to lock the strap 72 in place. The same process is repeated for the B and C phase conductors 50 and 60.

The separation assembly 14 is thus mounted directly and exclusively on the cables 30 with no direct connection to other parts of switchgear assembly. Even if the conductors 40, 50 and 60 apply forces causing oscillation or vibration of the separation assembly 14, such as lengthwise movement of the brace 70 at the free ends 86 and 88, the separation assembly 14 will not transmit those forces to other structures that support the busway 10 in the switchgear assembly.

With further reference to FIG. 1, another assembly of a retainer strap 72, ratchet mechanism 100, and housing 76 may be employed as the cable retainer assembly 12.

This written description sets for the best mode of carrying out the invention, and describes the invention so as to enable a person of ordinary skill in the art to make and use the invention, by presenting examples of the elements recited in the claims. The detailed descriptions of those elements do not impose limitations that are not recited in the claims, either literally or under the doctrine of equivalents.

The invention claimed is:

1. An apparatus comprising:
a plurality of distinct phase conductors, each of the distinct phase conductors including one or more insulated electrical cables;
an electrically nonconductive support brace having two opposite sides, and having apertures extending through the support brace between the two opposite sides of the support brace;
a plurality of retainer straps, each of the plurality of retainer straps reaching around a corresponding one of the plurality of distinct phase conductors at one of the two opposite sides of the support brace, and reaching further to the other of the two opposite sides of the support brace through a pair of the apertures extending through the support brace; and
a plurality of strap locks engaging the plurality of retainer straps to secure the plurality of retainer straps in place around the plurality of distinct phase conductors.

2. An apparatus as defined in claim 1 further comprising electrically nonconductive housings containing the strap locks, wherein each of the housings has an opening for passage of one of the strap locks, further has a clamshell configuration with a nominal condition in which the opening is slot-shaped, and is formed of elastically pliable material enabling deflection of the clamshell configuration to enlarge the opening sufficiently for passage of the ratchet mechanism into and out of the chamber through the opening.

3. An apparatus as defined in claim 2 wherein the strap locks include ratchet mechanisms.

4. An apparatus as defined in claim 3 wherein each of the ratchet mechanisms induces a spool with opposite end portions, each of the housings has a body portion defining a chamber that is sized and shaped to contain one of the ratchet mechanisms, and the body portion of each housing has opposed projecting portions defining recessed chamber sections configured to receive the opposite end portions of one of the spools.

5. An apparatus as defined in claim 1 wherein the two opposite sides of the support brace include a first side and a second side opposite the first side, each of the plurality of retainer straps reaches around a corresponding one of the plurality of distinct phase conductors at the first side, and each of the plurality of strap locks engages a corresponding one of the retainer straps at the second side.

6. An apparatus as defined in claim 1 wherein the support brace has a plurality of predetermined locations at which one of the retainer straps reaches around a corresponding one of the distinct phase conductors, and two or more of the apertures are located at each of the predetermined locations.

7. An apparatus as defined in claim 6 wherein multiple pairs of the apertures are located at each of the predetermined locations.

8. An apparatus comprising:

a ratchet mechanism including a spool;

an electrically nonconductive strap wound on the spool; and an electrically nonconductive housing having a chamber that is sized and shaped to contain the ratchet mechanism, an opening into the chamber, and a nominal condition in which the opening is not large enough for passage of the ratchet mechanism into and out of the chamber through the opening, wherein the housing is formed of elastically pliable material enabling deflection of the housing from the nominal condition to an opened condition in which the opening is enlarged sufficiently for passage of the ratchet mechanism into and out of the chamber through the opening.

9. An apparatus as defined in claim 8 wherein the housing has a clamshell configuration in which the opening is slot-shaped when the housing is in the nominal condition.

10. An apparatus as defined in claim 8 wherein the spool has opposite end portions, the housing has a body portion defining the chamber, and the body portion of the housing has opposed projecting portions defining recessed chamber sections configured to receive the opposite end portions of the spool.

11. An apparatus as defined in claim 8 wherein the housing further has first and second strap slots configured for passage of the strap.

12. An apparatus as defined in claim 11 wherein the housing is elongated with first and second ends, and the first and second strap slots are located at the first and second ends of the housing.

13. An apparatus as defined in claim 11 wherein the first and second strap slots are orthogonal to the slot-shaped opening when the housing is in the nominal condition.

14. An apparatus as defined in claim 11 wherein each of the first and second strap slots communicates with the slot-shaped opening.

15. An apparatus as defined in claim 8 wherein the housing includes a pair of flanges that extend along opposite sides of the opening, and the flanges have aligned rows of apertures configured for receiving fasteners to fasten the opening in a closed condition.

16. An apparatus for use with a plurality of distinct phase conductors, wherein each of the distinct phase conductors includes one or more insulated electrical cables, the apparatus comprising:

an electrically nonconductive support brace having apertures extending through the support brace;

a plurality of retainer straps, wherein each of the retainer straps is configured to have an installed position reaching through a corresponding pair of the apertures and around a corresponding one of the distinct phase conductors located at a side of the support brace; and a plurality of strap locks, wherein each of the plurality of strap locks is configured to engage a corresponding one of retainer straps to secure the corresponding one of the retainer straps in the installed position.

17. An apparatus as defined in claim 16 wherein the support brace has a plurality of predetermined locations at which a corresponding one of the distinct phase conductors is held against the support brace by the corresponding retainer strap when in the installed position, and two or more of the apertures are located at each of the predetermined locations.

18. An apparatus as defined in claim 17 wherein multiple pairs of the apertures are located at each of the predetermined locations.

19. An apparatus as defined in claim 17 wherein the support brace has a length and the predetermined locations are spaced apart along the length of the support brace.

20. An apparatus as defined in claim 17 wherein each of the predetermined locations on the support brace has an elongated surface region reaching lengthwise between a pair of the apertures.

\* \* \* \* \*